United States Patent [19]

Tisone et al.

[11] 4,172,020
[45] Oct. 23, 1979

[54] METHOD AND APPARATUS FOR MONITORING AND CONTROLLING SPUTTER DEPOSITION PROCESSES

[75] Inventors: Thomas C. Tisone, Thousand Oaks, Calif.; Thomas S. Latos, Carpenterville, Ill.

[73] Assignee: Gould Inc., Rolling Meadows, Ill.

[21] Appl. No.: 908,808

[22] Filed: May 24, 1978

[51] Int. Cl.² ................................. C23C 15/00
[52] U.S. Cl. ....................... 204/192 R; 204/192 F; 204/298
[58] Field of Search .......... 204/192 R, 192 F, 192 C, 204/192 SP, 298, 192 D

[56] References Cited

U.S. PATENT DOCUMENTS

| | | | |
|---|---|---|---|
| 3,738,926 | 6/1973 | Westwood et al. | 204/192 |
| 4,036,167 | 7/1977 | Lu | 118/7 |

OTHER PUBLICATIONS

J. E. Green et al., "Glow Discharge Optical Spectroscopy for Monitoring Sputter Deposited Film Thickness", *J. Vac. Sci. Technol.*, vol. 10, pp. 1144-1149 (1973).

W. D. Westwood et al., "Analysis of Sputtering Discharge By Optical & Mass Spectrometry", Parts 1 & 2, *J. Appl. Phys.*, pp. 2610-2626 (1973).

P. M. Schaible et al., "Deposition Measurements in a Cathode Sputtering System", *IBM Tech. Disc. Bull.*, vol. 6, p. 112 (1963).

J. W. Coburn, "A System for Determining the Mass & Energy of Particles Incident on a Substrate in a Planar Diode Sputtering System", *Rev. Sci. Inst.*, vol. 41, pp. 1219-1223 (1970).

J. W. Coburn et al., "Glow-Discharge Mass Spectrometry-Technique for Determining Composition Profiles in Solids", *J. Appl. Phys.*, vol. 45, pp. 1779-1786 (1974).

M. Hutt, "Microprocessor Automated Sputtering", *Solid-State Technology*, pp. 74-76 (1976).

Primary Examiner—Aaron Weisstuch
Attorney, Agent, or Firm—Charles E. Snee, III; George J. Netter

[57] ABSTRACT

A system is provided for monitoring sputtering deposition parameters and through closed-loop control achieving rapid modification of the parameters to maintain or to obtain a film composition. In reactive sputtering, the sputtering chamber has individual gas pressure controllers for the various gases to be added to the chamber. A holder for a substrate on which the film is to be deposited includes a heater with adjustable control. A differentially pumped quadrupole mass analyzer interconnects with the chamber bottom to receive a sample of plasma ions, measures the ionized species existing in the plasma and generates signals related to the film composition. A controller responsive to the quadrupole analyzer actuation adjusts the pressure of the one or more reactive or non-reactive gases being provided to the chamber, and/or controls other deposition parameters, such as substrate temperature or other plasma features.

15 Claims, 3 Drawing Figures

METHOD AND APPARATUS FOR MONITORING AND CONTROLLING SPUTTER DEPOSITION PROCESSES

BACKGROUND OF THE INVENTION

The invention relates generally to deposition processes, and, more particularly, to a system for monitoring various deposition parameters and effecting selective changes in these parameters to achieve a predetermined composition of deposited material.

Known equipment for producing thin-film devices by sputtering deposition techniques has not been completely satisfactory, especially where large quantity production and reproducibility is desired. This has been primarily because of past inability to monitor deposition parameters, such as substrate temperature, pressures of reactive gases, plasma composition, and the resulting microstructure of the device being deposited, with sufficient precision and rapidity to enable modification of selected parameters to achieve a predetermined composition and microstructure. Many attempts have been made in the past to determine the material composition being deposited by optical means, for example, in which the sputtering discharge of a system is monitored by a scanning spectrometer, and the light energy emitted from the plasma is thereby used to generate a signal functionally related to the composition of the deposited material. Reference is made to the article in the Journal of Vacuum Science Technology, Vol. 10, No. 6, November/December 1973, entitled *Glow Discharge Optical Spectroscopy for Monitoring Sputter Deposited Film Thickness* by J. E. Greene and F. Sequeda-Osorio.

In U.S. Pat. No. 3,738,926, METHOD AND APPARATUS FOR CONTROLLING THE ELECTRICAL PROPERTIES OF SPUTTERED FILMS, by W. D. Westwood and R. J. Boynton, two wavelengths of light emitted by the plasma are optically monitored, the intensities of which have been found to be related to the film electrical properties.

None of the known prior optical approaches provide a closed-loop control for sputtering deposition equipment to achieve high quantity production of films of predetermined characteristics.

In an article in the Journal of Aplied Physics, Vol. 44, No. 6, pages 2610-2618, June, 1973, W. D. Westwood and R. J. Boynton described mass spectrometric analysis of sputtering discharge; however, the analysis is concerned with the composition of the gases outside the discharge rather than the directly sputtered species in the discharge.

SUMMARY OF THE INVENTION

In the practice of the present invention, a system is provided for monitoring a number of sputtering deposition parameters and through closed-loop control achieving rapid modification of the various parameters in order either to maintain or to obtain a deposition composition of predetermined character. In particular, the described system is concerned with reactive sputtering in which controlled amounts of one or more gases are present in the sputtering chamber for reacting with the sputtering material to provide a deposited film (e.g., the cermet $Ta-Ta_2O_5$). The sputtering chamber has individual pressure controllers for the various gases to be added to the chamber and conventional means for initially evacuating the chamber to a high vacuum. A holder for a substrate on which the film is to be deposited includes a heater with adjustable control. A differentially pumped quadrupole mass analyzer of the kind generally described in the article by J. W. Coburn, Review of Scientific Instruments, Vol. 41, pages 1219-1223, (1970), also referred to here as a glow discharge spectrometer, is interconnected with the chamber bottom to receive a sample of plasma ions through a small opening. The quadrupole analyzer determines the relative quantities of the ionized species present in the plasma as the plasma is accelerated to the substrate and then generates signals related to the composition of the film then being deposited.

A controller responsive to the quadrupole analyzer actuation adjusts the pressure of the one or more reactive or non-reactive gases being provided to the chamber, and/or controls other deposition parameters, such as substrate temperature or other plasma features. A primary feature of the system control is that of obtaining the desired pressure of the gases added to the sputtering chamber to effect reactive sputtering. Thus, these pressures are closely monitored and can be rapidly modified by this system. In a typical situation, the system will have a background of reactive and noble gases such as water vapor, $O_2$, $N_2$, $Ar_2$, which affect film properties. The control system also enables discerning the effects of the various gases on deposition and initiating a new run, for example, at the precise time to insure reproducible chamber ambients for measured species. Still further, small amounts of a selected gas can be added to the chamber to control the natural effects of the background gases during conventional or non-reactive sputtering.

The substrate holder temperature (and thus the substrate temperature) and the sputtering cathode voltage are closely maintained at prescribed values or varied in accordance with a program for achieving a desired composition and microstructure. It is also possible by the described system to program variations in the one or more component gases and thereby achieve unusual composition profiles in a deposited film, e.g., periodic fluctuation in the pressure of oxygen, for example, will provide corresponding changes in the microstructure of a cermet film, whereas amplitude variations would control the volume fraction of a dielectric.

Since data rate requirements can be high and since control functions of a number of sputtering variables will be a part of the system, a computer may be advantageously incorporated into the system.

DESCRIPTION OF A PREFERRED FORM OF THE SYSTEM

Figure 1:
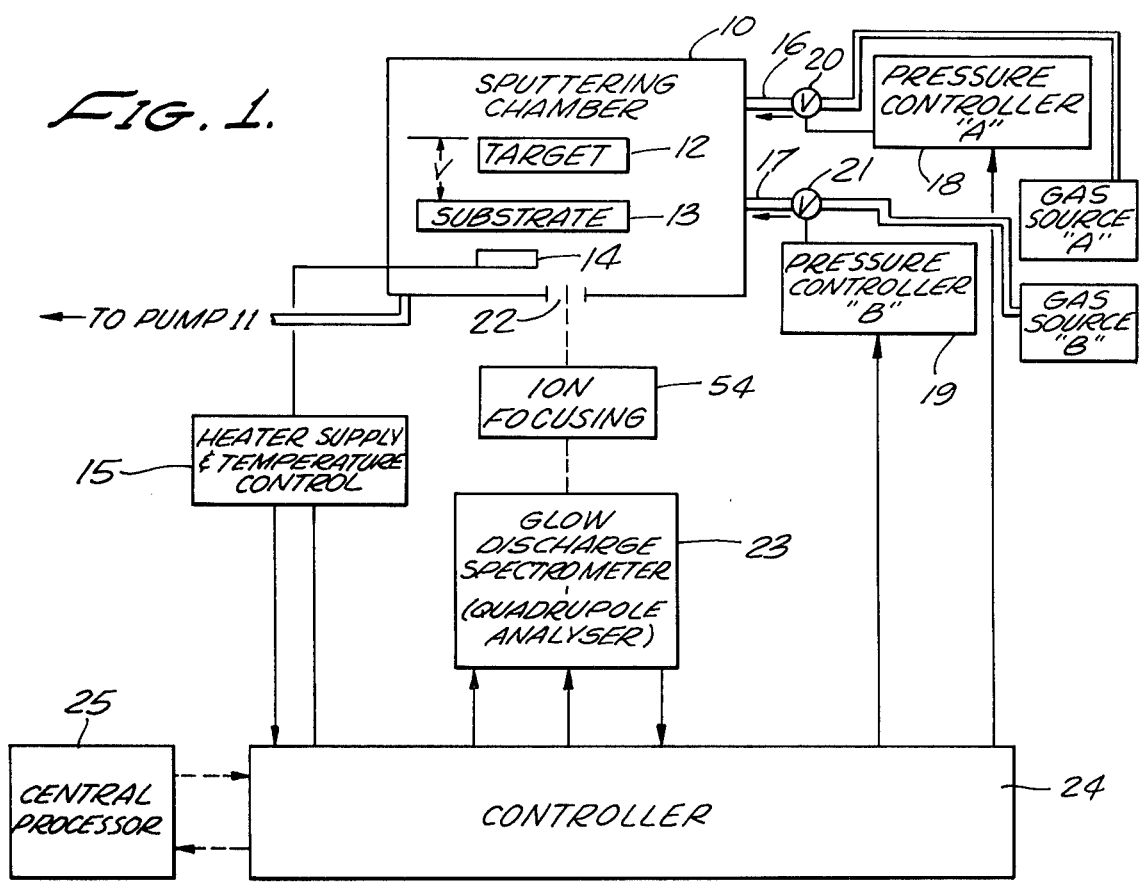
FIG. 1 is a function block schematic of the sputtering deposition control system.

With reference now to the drawing and particularly to FIG. 1, the system structure and operation are depicted in schematic form. The sputtering chamber 10 is essentially a hollow enclosure which is constructed to maintain a low pressure interior (e.g., $1 \times 10^{-6}$ TORR) and which includes a vacuum pumping means 11 interconnected therewith. A target 12 maintained at a large negative potential V and substrate 13 on which the film is to be deposited are located within the chamber. The physical principles of sputtering film deposition are well known and it is sufficient here to understand that when a high electric potential is established between a target (e.g., tantalum) and a substrate, the ambient gas (at a pressure in the range of $(0.5-50) \times 10^{-6}$ TORR) between the target and substrate is ionized and accelerated toward the target. Through momentum transfer, atoms from the target are ejected toward the substrate and deposited thereon as a film.

Although the system to be described is believed to have general utility for any type of sputtering deposition, it is especially advantageous in reactive sputtering where partial pressures of one or more select gases are added to the chamber which react with the target material, producing a modified deposited film. For example, using a tantalum target and a partial pressure of oxygen provides a cermet film consisting of metallic tantalum and tantalum oxide ($Ta-Ta_2O_5$). By the system of this invention, it is possible for the first time to produce, say, $Ta-Ta_2O_5$ cermets having a wide range of characteristics by maintaining the sputtering parameters within precise predetermined limits, or optionally, varying one or more of the sputtering parameters in accordance with any desired program.

Figure 2:
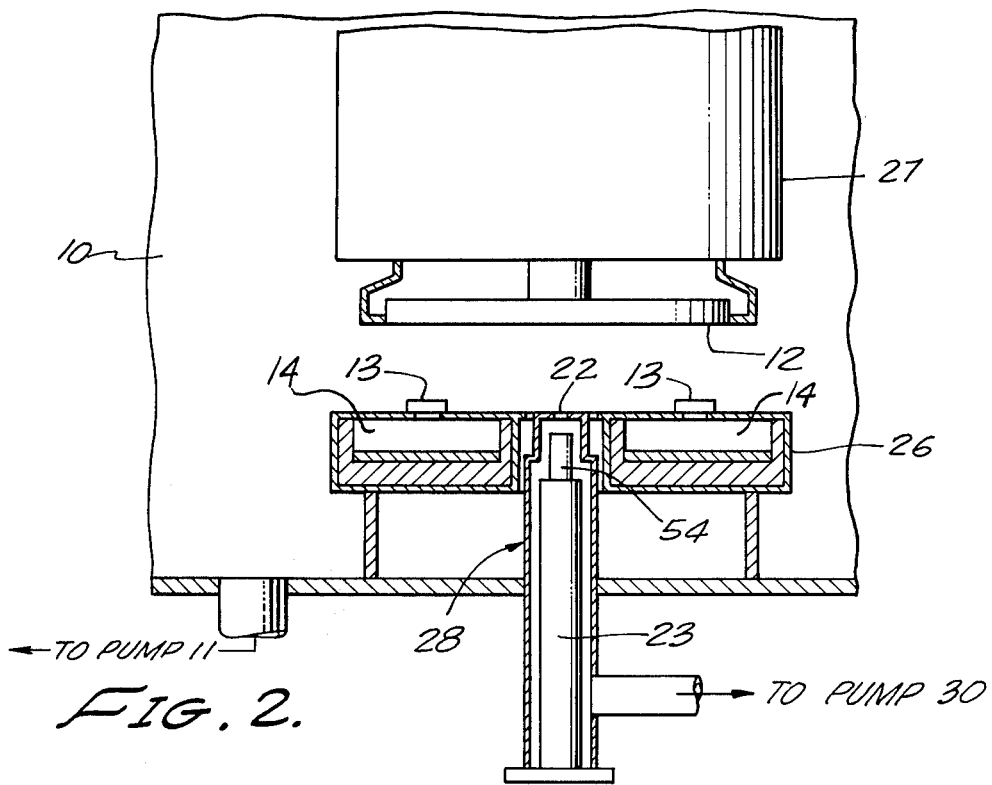
FIG. 2 is an elevational, partially sectional view of the sputtering chamber and part of the quadrupole analyzer interconnected.

Referring now to FIG. 2, substrate 13 is supported on a holder 26 which is provided with an electrical heater 14 furnished with selectively adjustable electrical power via a heater supply and temperature control 15 shown in FIG. 1. It has been found in reactive sputtering that the temperature of the substrate during deposition is an important factor in determining both the composition of the film and the film microstructure (e.g., grain size).

A pair of inlet conduits 16 and 17 communicate with the interior of the chamber 10, and are interconnected via respective pressure controllers 18 ("A") and 19 ("B") to sources of certain pressurized gases. The controllers 18 and 19 include respective metering valves 20 and 21 located within conduits 16 and 17, which are electrically actuatable to admit the gases to the chamber interior, thereby modifying the partial pressures of these gases in the chamber interior. The choice of these gases will depend upon the particular material being deposited. For example, in the production of a $Ta-Ta_2O_5$ cermet, the reactive gas is oxygen and the non-reactive gas is argon. In practical constructions of cermet films by reactive sputtering, the partial pressures of the reactive gases have been found to be highly influential on the composition of the film deposited. Excellent pressure controllers for this purpose are the Series 216 Automatic Pressure Controller manufactured and sold by Granville-Phillips Company, 5765 East Arapahoe Ave., Boulder, Colo. 80303.

Referring now to both FIGS. 1 and 2, an opening in the lower wall of the sputtering chamber located closely adjacent the substrate 12 enables a sample of the plasma ions to exit from the chamber through aperture 22. After focusing by lens 54, the ion sample is analyzed by a quadrupole mass spectrometer 23. The spectrometer 23 and lens 54 are referred to as a glow discharge spectrometer, which is the basic transducer of the system. Briefly, the glow discharge spectrometer produces an electric signal representative of the quantity of a given atomic species present in a plasma sample. In the present case, for example, the spectrometer will be monitoring the composition of the film being deposited.

It is considered beyond present purposes to give a detailed description of a glow discharge spectrometer, or to discuss theoretical aspects of mass spectrometry, and for such details reference can be made to the article in the Journal of Applied Physics, Volumn 45, No. 4, pp 1779-1786 April, 1974, entitled "Glow-Discharge Mass Spectrometry—Technique for Determining Elemental Composition Profiles in Solids" by J. W. Coburn, E. Taglauer and Eric Kay.

It is sufficient for present purposes to understand that the heart of such equipment is a so-called mass analyzer which sorts the different mass-charge ratios present in an ionized sample and allows one to determine the masses and the abundance or relative intensities of each ionic species present. It is important to note that there are two modes of mass analyzer operation: (1) monitoring of ionized species in the plasma, which includes ionized sputtered species; and (2) monitoring of background species by ionization in the quadrupole with a cross-ionized system as in residual gas analysis (cf. Westwood and Boynton article). Associated electronic equipment provides corresponding signal output representative of the various masses measured.

A controller 24 includes sources of voltage for operating the substrate heater and sputtering power supplies which provide the target and substrate bias voltages. Gas pressure controllers 18 and 19 are actuated to adjust the partial pressure of one or more gases in the sputtering chamber when the glow discharge spectrometer indicates a given gas should be increased or decreased. Controller 24 also commands the spectrometer as to the particular ion being measured. Switching circuits are included for providing selective interconnections to enable the pressure controllers and to set the spectrometer sensitivity and detection mode. A central processor 25 may be interconnected with the controller 24 to provide the capability of graded or periodic composition or microstructural variations, to provide raw spectra conditioning and data reduction, and to enable handling of the relatively high data rates that may be encountered. Still further, where a number of reactive gases are used in the sputtering chamber, it will be necessary to multiplex the spectrometer operations and the capability for doing this is incorporated into the controller 24.

Turning now particularly to FIG. 2, the sputtering chamber 10 is seen to include a hollow support structure 27 secured to the chamber walls with an electrical connection from the target 12 extending therefrom externally of the chamber to a suitable sputtering power supply. The target 12 is generally disclike and has a centrally secured support rod which maintains the target with a major area surface horizontally disposed and facing the chamber bottom and by which electric potential is applied to the target.

Mounted on and spaced from the chamber bottom wall is the substrate holder 26, which is a hollow disclike construction containing the heater 14, with a flat upper surface on which one or more substrates 13 are located, preferably symmetrically about the axial opening 22. An elongated cylindrical differentially pumped housing 28 is vertically oriented with an upper end defined by the opening 22. The opening 22 permits ions from the plasma located between the target 12 and the substrate table 26 to pass into the quadrupole chamber. The housing 28 and quadrupole analyzer extend through and are sealed to the chamber bottom wall. A focusing lens 54 operates to focus ions passing through opening 22 into a narrow beam which passes into the quadrupole analyzer 23. A pump 30 maintains the analyzer at proper operating pressure.

The ion focusing means 54 receives ions from the chamber, which are travelling generally downwardly throughout a solid angle defined by the opening 22, and focuses these incoming angularly dispersed ions into a pencil of ions moving along substantially parallel paths into the quadrupole analyzer. There may be incorporated within the ion focusing means an ion/electron discriminator which enhances operation of the analyzer by reducing background signal levels.

Exemplary of operation of the described system, assume that it is desired to produce a cermet film of 20% $O_2$ atoms tantalum-tantalum oxide (Ta-$Ta_2O_5$) on the substrates 13 by reactive sputtering of a tantalum target. The reactive gas for this purpose is oxygen, which is admitted with the noble gas argon. With appropriate pump-down, pressurization with argon to $15 \times 10^{-3}$ TORR $\pm 1\%$, and energization with a D. C. target sputtering voltage of $-917$ volts $\pm 1\%$, deposition of the metal will be initiated. With the quadrupole analyzer multiplexed to detect Ta+ and TaO+ ions representative of the deposited film in a ratio of Ta+ = 6 TaO+, it will, accordingly, now show initially the absence of oxygen (i.e., TaO+) and the controller 24 will actuate pressure controller 19 to increase the oxygen partial pressure in the chamber. The difference or error between the desired ratio and the detected ratio may also be reduced toward zero by adjusting the sputtering acceleration voltage during deposition using controller 24 and central processor 25 in a prescribed manner, thus modifying the deposited film. This cycle of plasma ions being analyzed by the quadrupole followed by increasing the oxygen partial pressure and/or adjusting the sputtering acceleration voltage is continued until the desired amount of oxygen is present and the corresponding ionic ratio is obtained. Although oxygen had been used as an example, other gases may be used with the oxygen, or as an alternative thereto. The substrate temperature was controlled in a practical working of the invention to 230° C. during film preparation and the $O_2$ atom % composition was verified by Auger analysis.

The argon is not actually part of the reactive process as such, but is used to provide the necessary positive ions for bombarding the target and thereby dislodging target atoms to be transferred to the substrate. The automatic control of argon pressure can be achieved in a manner similar to that described for oxygen, or as an alternative the argon pressure may be controlled by sensing chamber pressure by an electronic manometer.

By the described system it is not only possible to deposit a film of given composition, but to reproduce precisely and automatically the given initial chamber conditions and deposited film for any number of production runs. Also, it is possible to obtain films with graded composition or periodically changed composition by placing system operation under program control. The system may also be used for accurate control and reproducibility of film thickness by integration of glow discharge spectrometer signal levels with time and terminating the deposition process when the integral reaches a predetermined value. For example, the metal and metal oxide signals may be integrated over time to form a signal proportional to film thickness and deposition rate. This signal, in turn, may be compared to the predetermined value to identify the termination time for the process.

Figure 3:
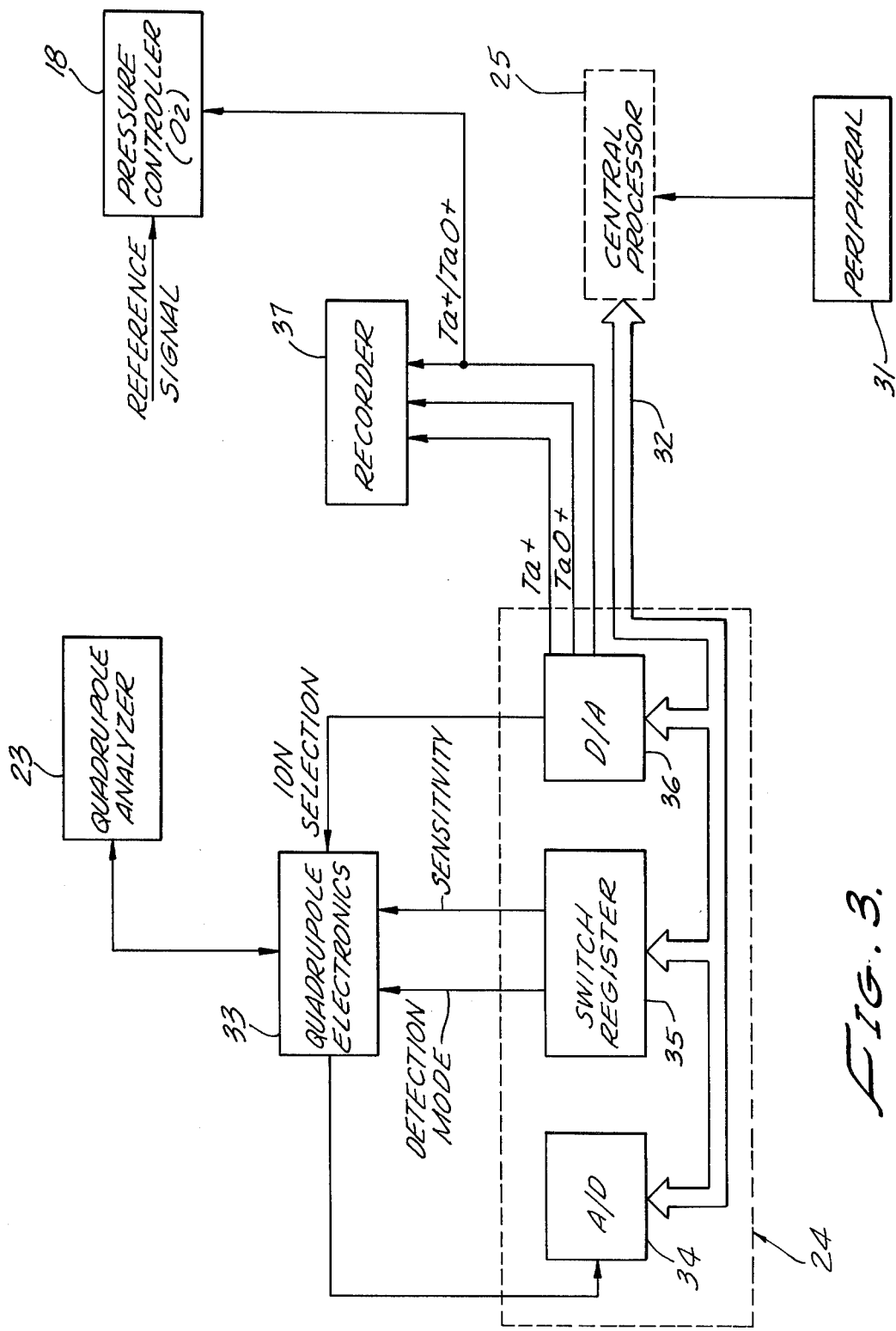
FIG. 3 is a further, more detailed, function block schematic of control circuits.

FIG. 3 of the drawing illustrates in block diagram the more specific control aspects of the quadrupole analyzer and the oxygen gas pressure controller 18. The computer receives input parameters via a peripheral 31 (e.g., teletype) for such things as ion signal selection, detection method, sensitivity, and number of signals to be averaged, among the most important. The computer interacts with the function block circuit 24 shown in dashed line via the computer bus 32, specific interconnections not being shown since they are considered to be within the skill of one versed in the present day computer arts.

The quadrupole electronics 33 provides an analog signal output from the quadrupole representative of the magnitude of the concentration of the ions being monitored, to an analog/digital converter 34, which in turn stores the signal information in the processor memory. The binary output register 35 is used to provide control signals to the quadrupole electronics to select detection sensitivity and mode and to enable selected pressure controllers on command of the computer. Moreover, an analog control signal (ION SELECTION) defining the particular ion to be monitored by the quadrupole is provided via a digital/analog converter 36 in response to computer directions.

With regard to the example of depositing a cermet film of Ta-$Ta_2O_5$, two ionic currents in the plasma are sequentially detected and stored in memory. These two ionic current signals are then converted to corresponding analog signals (Ta+, TaO+) by the D/A converter 36, as well as a ratio analog signal, Ta+/TaO+, which is first calculated by the processor, using the magnitude information stored in memory. The ratio signal is applied to the pressure controller 18, and on comparison with a predetermined reference, if an error signal exists, then the controller 18 admits oxygen to the sputtering chamber. Recorder 37 is optionally provided to monitor controller activity. Of course, in the event of several reactive gases being required, the described operation may be multiplexed for the different gases, and different combinations, or ratios, or other algorithms composed of various ion signals may be used for the control function.

What is claimed is:

1. A system for monitoring and controlling the sputtering deposition of materials on a substrate located within a sputtering chamber, during which sputtering deposition a plasma glow discharge is produced, comprising:

a housing communicating with the interior of the chamber to receive a sample of plasma ions therefrom;

a mass spectrometer located within said housing intercepting the plasma ions from the chamber and providing signals representative of the quantity of certain ions present in the sample;

means responsive to the spectrometer signals for comparing said spectrometer signals with reference signals representative of a given sputtering condition and for generating an error signal when said spectrometer signals and reference signals differ; and means actuated by said error signal for modifying said sputtering condition in a manner to reduce the error signal.

2. A system as in claim 1, in which the chamber is adapted to contain a quantity of at least one reactive gas and the means for modifying said sputtering condition includes a pressure controller responsive to said error signal for modifying the admission of the reactive gas to the sputtering chamber.

3. A system as in either of claims 1 or 2, in which there is further provided within the housing means for intercepting the plasma ions from the chamber opening and focusing said ions into a beam onto the mass spectrometer.

4. A system as in claim 1, in which there are further provided means for heating the substrate and said means actuated by the error signal being interconnected with the heating means for adjustably controlling the heating of said substrate during deposition and thereby controlling the composition and microstructure of the material deposited.

5. A system as in claim 1, in which the chamber is adapted to contain first and second amounts, respectively, of a noble gas and another gas and said means for modifying said sputtering condition includes first and second pressure controllers responsive to error signals for modifying addition of the noble gas and the other gas into the chamber.

6. A method of sputter deposition onto a substrate of a film consisting of a cermet comprising a metal and an oxide of the metal, which comprises the steps of:
   sputter depositing the metal onto a substrate in a gaseous environment including a partial pressure of oxygen;
   directing a sample of ions from the sputtering plasma into a mass spectrometer;
   quantitatively detecting the metal ions present in the plasma sample by the mass spectrometer and forming a first electric signal representative thereof;
   quantitatively detecting the metal oxide ions present in the plasma sample by the mass spectrometer and forming a second electric signal representative thereof;
   combining said first and second signals in a predetermined manner to form a third electric signal;
   comparing the third signal with a predetermined reference signal;
   forming an error signal when on comparison the third signal differs from the reference signal; and
   varying the rate of addition of oxygen to the gaseous environment as to reduce the error signal toward zero.

7. A method of sputter deposition as in claim 6, in which the reference signal is varied in a predetermined manner during deposition.

8. A method of sputter deposition as in either of claims 6 or 7, in which there is provided the further step of maintaining the substrate at a prescribed temperature during deposition thereof.

9. A method of sputter deposition as in either of claims 6 or 7, in which there is provided the further step of varying the sputtering acceleration voltage during deposition in a prescribed manner to reduce the error signal toward zero to produce an accordingly modified deposited film.

10. A method of sputter deposition as in either of claims 6 or 7, which further includes combining said first and second signals to form a fourth electric signal, and comparing the fourth signal with another reference signal relating to predetermined film thickness and deposition rate.

11. A method of reactive sputter deposition of a film onto a substrate consisting of a substance sputtered from a target and a compound of the target substance formed by reaction with a reactive gas in the sputtering chamber, which comprises the steps of:
   sputter depositing the target substance onto a substrate in the presence of the reactive gas including a partial pressure of a noble gas;
   sampling ions in the sputtering plasma by a mass spectrometer;
   detecting the target substance ions present in the plasma sample by the mass spectrometer and forming a first electric signal representative of the quantity thereof;
   detecting the compound substance ions present in the plasma sample by the mass spectrometer and forming a second electric signal representative of the quantity thereof;
   combining said first and second signals to form a third electric signal;
   comparing the third signal with a predetermined reference signal;
   forming an error signal when on comparison the third signal differs from the reference signal; and
   varying the amount of reactive gas in sputtering chamber to reduce the error signal toward zero.

12. A method of reactive sputter deposition as in claim 11, in which the reference signal is varied in a predetermined manner during deposition.

13. A method of reactive sputter deposition as in either of claims 11 or 12, in which there is provided the further step of heating the substrate to a prescribed temperature during deposition thereof.

14. A method of reactive sputter deposition as in either of claims 11 or 12, in which there is provided the further step of varying the sputtering acceleration voltage during deposition in a prescribed manner to produce an accordingly modified deposited film.

15. A method of sputter deposition in a chamber during which a plasma glow discharge occurs, which comprises the steps of:
   focusing a sample of ions in the plasma onto a mass spectrometer;
   detecting ions of certain substances present in the plasma sample by the mass spectrometer and forming a first electric signal representative of the quantity of said certain substances present;
   developing an error signal when said first and reference signals differ; and
   modifying the sputter deposition responsive to said error signal in a manner reducing the error signal toward zero.

* * * * *